United States Patent
Kugai

[11] Patent Number: 5,856,205
[45] Date of Patent: Jan. 5, 1999

[54] JOSEPHSON JUNCTION DEVICE OF OXIDE SUPERCONDUCTOR HAVING LOW NOISE LEVEL AT LIQUID NITROGEN TEMPERATURE

[75] Inventor: Hirokazu Kugai, Hyogo, Japan

[73] Assignee: Sumitomo Electric Industries, Ltd.

[21] Appl. No.: 822,474

[22] Filed: Mar. 24, 1997

Related U.S. Application Data

[63] Continuation of Ser. No. 672,303, Jun. 28, 1996, abandoned, which is a continuation of Ser. No. 220,448, Mar. 30, 1994, abandoned.

[30] Foreign Application Priority Data

Mar. 31, 1993 [JP] Japan .................................. 5-096974

[51] Int. Cl.$^6$ .................................................. H01L 21/36
[52] U.S. Cl. ................ 438/2; 505/310; 505/320
[58] Field of Search ........................ 257/34, 35; 505/190, 505/191, 234, 238, 237, 239, 700–702, 126, 162, 310, 320; 438/2; 29/599

[56] References Cited

U.S. PATENT DOCUMENTS

| | | | |
|---|---|---|---|
| 5,077,266 | 12/1991 | Takagi et al. | 257/34 |
| 5,157,466 | 10/1992 | Char et al. | 357/5 |

FOREIGN PATENT DOCUMENTS

| | | | |
|---|---|---|---|
| 0 287 383 | 10/1988 | European Pat. Off. | |
| 03-234071 | 10/1991 | Japan | 257/35 |
| 04-268774 | 9/1992 | Japan | 257/34 |

OTHER PUBLICATIONS

Ivanov, Z. G. et al., "Weak Links and dc SQUIDS on Artificial Nonsymmetric Grain Boundaries in YBa$_2$CU$_3$O$_{7-\delta}$", Appl. Phys. Lett., vol. 59 (23), pp. 3030–3032 (Dec. 2, 1991).

Olsson, H. K. et al., "Low 1/f noise in YBa$_2$Cu$_3$O$_7$ dc SQUIDs on (Y)ZrO$_2$ bicrystal Substrates", Appl. Phys. Lett., vol. 61 (7), pp. 861–862 (Aug. 17, 1992).

Olsson et al "Low 1/f Noise . . . " Appl. Phys. Lett. 61 861 (1992).

Kubo et al "Effects of Oxygen . . . " Jap. J. Appl. Phys. 26 L 768 (1987).

Soderholm et al "Incorporation of Pr . . . " Nature 328 604 (1987).

Clark et al "Effects of Radiation . . . "Appl. Phys. Lett. 51 139 (1987).

Kubo et al, "Effect of Oxygen–Deficiency on the Crystal Structure and Superconducting Properties of YBaCuO," Jap. J. of Appl. Phys., vol. 26, No. 5, May 1987, pp. L768–L770.

Soderholm et al, "Incorporation of Pr in YBCO:Electronic Effects on Superconductivity", Nature, vol. 328, 13 Aug. 1987, pp. 604–605.

Tarascon et al, "3d–Metal Doping (Fe, Co, Ni, Zn) of the High TC Perovskite YBCO", Materials Research Society, Hi–TC Superconductors Symposium, Dec. 1987, pp. 523–526.

Database WPI, Section El, Week 9937, Derwent Publications Ltd., London, GB; Class U14, AN 93–293362 & SE–A–9 103 583 (Telefonaktiebolaget Ericsson L M) 4 Jun. 1993 *abstract*.

Patent Abstracts of Japan, vol. 016, No. 307 (E–1229), 7 Jul. 1992 & JP–A–04 084 469 (Riken Corp) 17 Mar. 1992 *abstract*.

*Primary Examiner*—Charles Bowers
*Assistant Examiner*—Craig Thompson
*Attorney, Agent, or Firm*—Foley & Lardner

[57] ABSTRACT

In a Josephson junction device comprises two superconducting electrodes formed of an oxide superconductor and connected through a Josephson junction, a temperature dependent noise of the Josephson junction becomes the minimum at a liquid nitrogen temperature.

12 Claims, 2 Drawing Sheets

JOSEPHSON JUNCTION DEVICE OF OXIDE SUPERCONDUCTOR HAVING LOW NOISE LEVEL AT LIQUID NITROGEN TEMPERATURE

This application is a continuation of application Ser. No. 08/672,303, filed Jun. 28, 1996, now abandoned; which is a continuation of application Ser. No. 08/220,448, filed Mar. 30, 1994, abandoned.

BACKGROUND OF THE INVENTION

1. Field of the Invention

The present invention relates to a Josephson junction device of an oxide superconductor having low noise level at liquid nitrogen temperature, and more specifically to a Josephson junction device of an oxide superconductor having a weak link of a Josephson junction consisting of a grain boundary between two single crystal oxide superconductor regions having low noise level at liquid nitrogen temperature.

2. Description of Related Art

A Josephson junction device is one of superconducting devices comprising two superconducting electrode connected through a Josephson junction. The Josephson junction device can be realized in various structures. Among the various structures, the most preferable structure in practice is a tunnel type Josephson junction device realized by a thin non-superconductor layer sandwiched between a pair of superconducting electrodes. However, a point contact type Josephson junction device, a micro bridge type Josephson junction device and a variable thickness bridge type Josephson junction device composed of a pair of superconductor electrodes which are weakly linked to each other also exhibit Josephson effect.

The Josephson junction device is expected to be applied to a high speed switching element and a high sensitive sensor due to its characteristics. In particular, by using high critical temperature oxide superconductors, recently advanced in study, for superconducting electrodes, it is possible to manufacture Josephson junction devices which operate under liquid nitrogen cooling.

These Josephson junction devices have fine structures so that fine processings are necessary to manufacture the Josephson junction devices. For example, in order to manufacture a tunnel type Josephson junction device, a first superconductor thin film, a non-superconductor thin film and a second superconductor thin film are stacked on a substrate in the named order.

The thickness of the non-superconductor layer of the tunnel type Josephson junction device is determined by the coherence length of the superconductor. In general, the thickness of the non-superconductor layer of the tunnel type Josephson junction device must be within a few times of the coherence length of the superconductor. In case of using an oxide superconductor for the superconducting electrodes, a thickness of a non-superconductor layer must be about a few nanometers, because oxide superconductor materials have very short coherence length.

However, the superconductor layers and the non-superconductor layer of the tunnel type Josephson junction device must be highly crystallized for favorable properties. It is difficult to stack an extremely thin and high crystalline non-superconductor layer on an oxide superconductor layer. Additionally, it is very difficult to stack a high crystalline oxide superconductor layer on the non-superconductor layer stacked on an oxide superconductor layer. Though the stacked structure including a first oxide superconductor layer, a non-superconductor layer and a second oxide superconductor layer is fabricated, the interfaces between the oxide superconductor layers and the non-superconductor layer are not in good condition so that the tunnel type Josephson junction device does not function in good order.

In the point contact type Josephson junction device, the micro bridge type Josephson junction device and the variable thickness bridge type Josephson junction device, two superconducting electrodes are contact with each other through an extremely small contact area so as to realize a weak link of a Josephson junction. Therefore, very fine processings are also necessary to manufacture the point contact type Josephson junction device, the micro bridge type Josephson junction device and the variable thickness bridge type Josephson junction device. It is very difficult to conduct the fine processings of oxide superconductors with good repeatability.

In order to resolve the above mentioned problems, so-called grain boundary weak link type Josephson junction devices are proposed in a prior art. A Josephson junction device of this type comprises a substrate having a principal surface and an oxide superconductor thin film formed on the principal surface of the substrate. The oxide superconductor thin film has two single crystal regions and a grain boundary between them, which form a weak link of a Josephson junction. Each of the single crystal regions of the oxide superconductor thin film constitutes a superconducting electrode. Thus, the above oxide superconductor thin film constitute a Josephson junction device.

The above grain boundary weak link type Josephson junction device can be manufacture by depositing an oxide superconductor thin film on a bicrystal substrate, a substrate having a proper seed layer on a portion of its principal surface or a substrate having a step on a portion of its principal surface.

No fine processing which is required to manufacture a point contact type Josephson junction device, a micro bridge type Josephson junction device or a variable thickness bridge type Josephson junction device is necessary to manufacture the grain boundary weak link type Josephson junction device.

In case of applying a Josephson junction device to a sensor, a problem of noise arises. When a Josephson junction device is used as a sensor, a power is supplied so that current flows through its Josephson junction and voltage changes between its two superconducting electrodes are measured.

However, there are noises in this voltage change and it can be easily understood that sensitivities of the sensors using Josephson junction devices can be improved by reducing noise level. In particular, the noises are noticeable in Josephson junction devices utilizing oxide superconductors at frequency lower than on the order of 100 Hz.

The noises at low frequency of the Josephson junction devices utilizing oxide superconductor thin films are primarily the sum of one caused by critical current fluctuations and one caused by flux motion and are dependent on 1/f (f: frequency). These are also temperature dependent so that their levels change as temperature of the Josephson junction devices change.

The critical current fluctuation noise becomes larger at a lower temperature and the flux noise has a peak near the critical temperature of the oxide superconductor. Hence, the noises of the Josephson junction devices utilizing oxide superconductor thin films become the minimum at temperatures little lower than the critical temperatures of the oxide superconductors.

H. K. Olsson et al. reported about the 1/f noise of dc SQUID utilized $Y_1Ba_2Cu_3O_{7-x}$ oxide superconductor in Appl. Phys. Letter vol. 61, No. 7, pp. 861–863, Aug. 17, 1992.

For example, the critical temperature of $Y_1Ba_2Cu_3O_{7-x}$ oxide superconductor is higher than 85K and a temperature at which a Josephson junction device utilizing $Y_1Ba_2Cu_3O_{7-x}$ oxide superconductor has the minimum noise is on the order of 80K. Therefore, the Josephson junction device has a higher noise level at a liquid nitrogen temperature. In order to use the Josephson junction device at the temperature of the minimum noise, its temperature should be controlled by liquid helium cooling with heating by heater. Namely, the highest performance of the Josephson junction device can not be obtained under simple liquid nitrogen cooling.

The same is true for Josephson junction devices utilizing Bi—Sr—Ca—Cu—O type oxide superconductors and Tl—Ba—Ca—Cu—O type oxide superconductors. Since, the Bi—Sr—Ca—Cu—O type oxide superconductors and Tl—Ba—Ca—Cu—O type oxide superconductors have critical temperatures higher than 90K.

SUMMARY OF THE INVENTION

Accordingly, it is an object of the present invention to provide a Josephson junction device of an oxide superconductor having low noise level at liquid nitrogen temperature, which have overcome the above mentioned defects of the conventional ones.

Another object of the present invention is to provide a Josephson junction device of an oxide superconductor having a weak link of a Josephson junction consisting of a grain boundary of two single crystal oxide superconductor regions having low noise level at liquid nitrogen temperature.

The above and other objects of the present invention are achieved in accordance with the present invention by a Josephson junction device comprising two superconducting electrodes formed of an oxide superconductor and connected through a Josephson junction wherein a temperature dependent noise of the Josephson junction becomes the minimum at a liquid nitrogen temperature.

A temperature rise of the Josephson junction device due to Joul heat is negligible. Since, current flowing through the Josephson junction device is very weak such as several tens to several hundreds micro amperes and a resistor of the Josephson junction is smaller than several ohms so that the Joul heat generated is extremely small. Therefore, the terms "at a liquid nitrogen temperature" and "under liquid nitrogen cooling" are considered to be the same meaning in this specification.

In accordance with the present invention, there is also provided a Josephson junction device in which a temperature and frequency dependent noise of the Josephson junction becomes the minimum at a liquid nitrogen temperature. It is preferable that a temperature and frequency dependent noise at 10 Hz of the Josephson junction becomes the minimum at a liquid nitrogen temperature.

Preferably, a critical temperature of the oxide superconductor of the Josephson junction device in accordance with the present invention is lowered from the highest critical temperature so that the temperature dependent noise of the Josephson junction becomes the minimum at a liquid nitrogen temperature.

In one preferred embodiment of the present invention, the Josephson junction device is formed of an oxide superconductor thin film comprising two single crystal regions having different crystal orientations, which constitute the superconducting electrodes and a grain boundary between the two single crystal regions which constitutes a weak link of the Josephson junction.

In this case, it is possible that the Josephson junction device comprises a bicrystal substrate of misorientation angle of 37° and the oxide superconductor thin film is formed on the substrate, which inherits the misorientation angle so as to include two single crystal regions which constitutes the superconducting electrodes and a grain boundary between the two single crystal regions which constitutes a weak link of the Josephson junction. In this embodiment, it is preferable that the oxide superconductor includes less amount of oxygen than a composition of the highest critical temperature. In an alternative embodiment, the oxide superconductor includes an impurity so that its critical temperature is lowered.

In a preferred embodiment, the compound oxide superconductor thin film is formed of a high-$T_c$ (high critical temperature) oxide superconductor, particularly, formed of a high-$T_c$ copper-oxide type compound oxide superconductor for example a Y—Ba—Cu—O type compound oxide superconductor material, a Bi—Sr—Ca—Cu—O type compound oxide superconductor material, and a Tl—Ba—Ca—Cu—O type compound oxide superconductor material.

In addition, the substrate can be formed of a single crystal oxide substrate such as a MgO (100) substrate, a $SrTiO_3$ (110) substrate, an yttrium stabilized zirconia (YSZ) substrate, etc.

The above and other objects, features and advantages of the present invention will be apparent from the following description of preferred embodiments of the invention with reference to the accompanying drawings.

BRIEF DESCRIPTION OF THE DRAWINGS

FIG. 1B shows a diagrammatic sectional view.

DESCRIPTION OF THE PREFERRED EMBODIMENTS

Embodiment 1

Figure 1A:
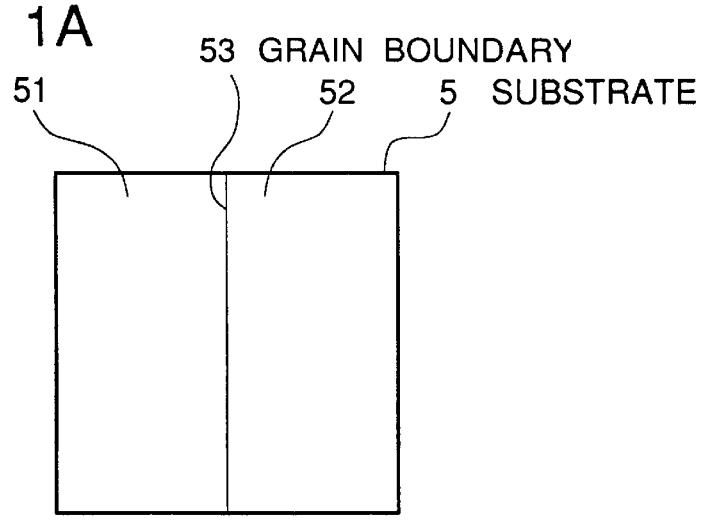
FIGS. 1A to 1C are diagrammatic views for illustrating one embodiment of the process for manufacturing the Josephson junction device in accordance with the present invention, in that FIGS. 1A and 1C show diagrammatic plane views
Figure 1B:
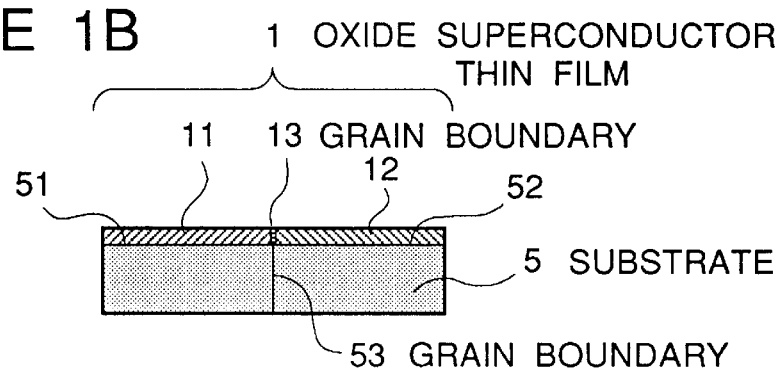
Figure 1C:
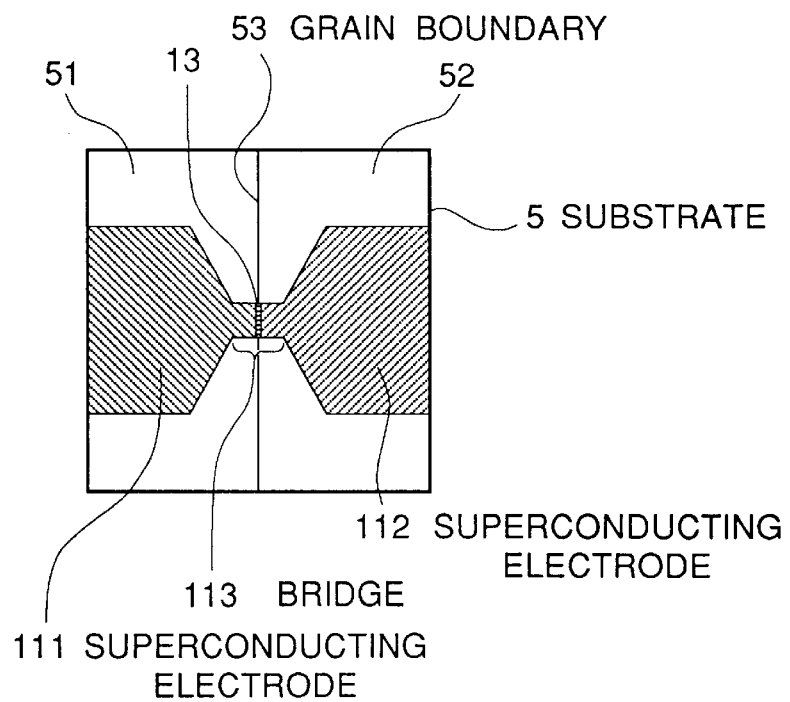

Referring to FIGS. 1A to 1C, the process for manufacturing a first embodiment of Josephson junction device in accordance with the present invention will be described.

As shown in FIG. 1A, a bicrystal $SrTiO_3$ substrate 5 was prepared. The bicrystal $SrTiO_3$ substrate 5 had two single crystal regions 51 and 52 which had different but symmetric crystal orientations. The misorientation angle between the two regions 51 and 52 was 37° and the deposition surface of the bicrystal substrate was (100) surface in both halves. A grain boundary 53 was formed between the two single crystal regions 51 and 52 of the bicrystal substrate.

Then, as shown in FIG. 1B, a c-axis orientated $Y_1Ba_2Cu_3O_{7-x}$ (0<x<0.3) oxide superconductor thin film 1 having a thickness of 300 nanometers was deposited on the (100) surface of the bicrystal substrate 5 by a sputtering process using a sintered $Y_1Ba_2Cu_3O_{7-x}$ oxide superconductor pellet as a target. The conditions of the sputtering process were as follows;

| Temperature of substrate | 650° C. |
|---|---|
| Sputtering gases | |
| Ar | 8 sccm |
| $O_2$ | 4 sccm |
| Pressure | $5 \times 10^{-2}$ Torr |

The $Y_1Ba_2Cu_3O_{7-x}$ oxide superconductor thin film 1 inherited the bicrystal structure of the substrate 5 so as to comprise two single crystal regions 11 and 12 which had different but symmetric crystal orientations, and a grain boundary 13 between the two single crystal regions 11 and 12. The misorientation angle between the two regions 11 and 12, namely an angle between a-axes or b-axes of crystal lattices of regions 11 and 12 was 37° and the grain boundary 13 constituted a weak link of a Josephson junction.

The critical temperature of the $Y_1Ba_2Cu_3O_{7-x}$ oxide superconductor thin film 1 was 90K.

Thereafter, as shown in FIG. 1C, the $Y_1Ba_2Cu_3O_{7-x}$ oxide superconductor thin film 1 was etched by ion milling using Ar ion so that superconducting electrodes 111 and 112 and a bridge portion 113 having a length of 10 $\mu$m and a width of 5 $\mu$m on the center portion of which the grain boundary 13 was positioned, were formed. No clear degradation was observed in the superconducting properties of the $Y_1Ba_2Cu_3O_{7-x}$ oxide superconductor thin film 1 after the patterning.

Then, the substrate 5 was heated to a temperature of 800° C. under vacuum for twenty minutes so that some oxygen of the patterned $Y_1Ba_2Cu_3O_{7-x}$ oxide superconductor thin film 1 was removed.

It is preferable that the temperature of this heat treatment is 700° to 1000° C. and the duration is 1 to 20 minutes.

By the heat treatment, the $Y_1Ba_2Cu_3O_{7-x}$ oxide superconductor became $Y_1Ba_2Cu_3O_{7-y}$ oxide superconductor (0.3<y<0.5) and its critical temperature was lowered to 81K.

Figure 2:
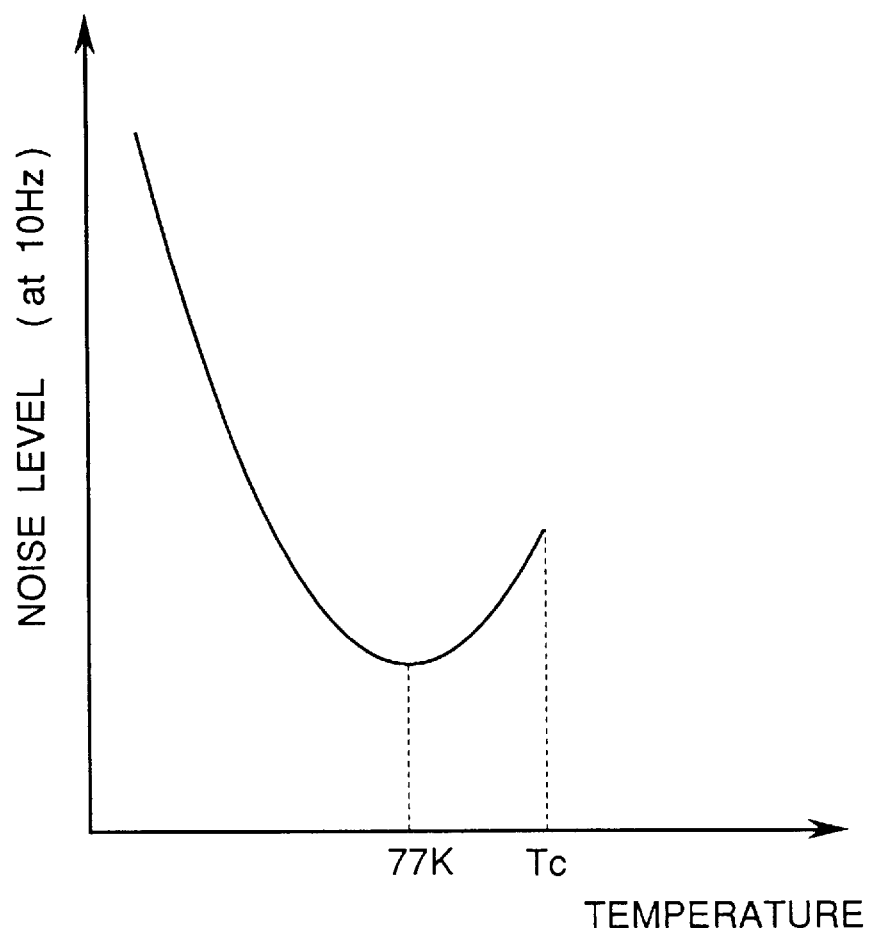
FIGS. 2 is a graph of the noise level at 10 Hz against the temperature for the Josephson junction devices manufactured in Embodiments.

A current-voltage characteristics of the above mentioned Josephson device was measured. When a microwave of 15 GHz and of 0.2 mW was irradiated at 77K, clear Shapiro steps were observed at multiple voltages of 31 $\mu$V, and therefore, it could be ascertained that the Josephson junction was fabricated in the device. In addition, voltage noise at 10 Hz became the minimum at a temperature of 77K, as shown in FIG. 2.

Therefore, it was also confirmed that the above Josephson junction device in accordance with the first embodiment of the present invention had the highest performance under simple liquid nitrogen cooling. In this connection, a temperature rise of the Josephson junction device due to Joul heat was negligible. Since, current flowing through the Josephson junction device was very weak such as several tens to several hundreds micro amperes and a resistor of the Josephson junction was smaller than several ohms so that the Joul heat was extremely small. Therefore, the terms "at a liquid nitrogen temperature" and "under a liquid nitrogen cooling" are considered to be the same meaning.

In the above embodiment, only an artificial grain boundary type Josephson junction device utilizing a bicrystal substrate was described. However, as it is easily understood, the present invention can be applied to every Josephson junction device utilizing oxide superconductors, such as an artificial grain boundary type Josephson junction device utilizing a seed layer, a step type Josephson junction device and a tunnel type Josephson junction device.

Embodiment 2

A second embodiment of the Josephson junction device in accordance with the present invention having an equal shape to that of Embodiment 1 was manufactured. The process will be described.

At first, a bicrystal $SrTiO_3$ substrate equal to that of Embodiment 1, namely having a deposition surface of (100) plane and a misorientation angle of 37° was prepared.

Then, a c-axis orientated $(Y, Pr)_1Ba_2Cu_3O_{7-x}$ (0<x<0.3) oxide superconductor thin film having a thickness of 300 nanometers was deposited on the (100) surface of the bicrystal substrate by a sputtering process using a sintered $(Y, Pr)_1Ba_2Cu_3O_{7-x}$ oxide superconductor pellet as a target. The conditions of the sputtering process were equal to those of Embodiment 1.

The $(Y, Pr)_1Ba_2Cu_3O_{7-x}$ oxide superconductor thin film inherited the bicrystal structure of the substrate so as to comprise two single crystal regions which had different but symmetric crystal orientations, and a grain boundary between the two single crystal regions. The misorientation angle between the two single crystal regions was 37° and the grain boundary constituted a weak link of a Josephson junction.

The $(Y, Pr)_1Ba_2Cu_3O_{7-x}$ oxide superconductor is a solid solution in which some Y sites of $Y_1Ba_2Cu_3O_{7-x}$ oxide superconductor are replaced by Pr and has a lower critical temperature than that of $Y_1Ba_2Cu_3O_{7-x}$ oxide superconductor. If Pr amount is increased, the critical temperature becomes lower.

In this embodiment, an atomic ratio of Pr/Y of 0.05 was employed so that the $(Y, Pr)_1Ba_2Cu_3O_{7-x}$ oxide superconductor thin film had a critical temperature of 81K.

Thereafter, the $(Y, Pr)_1Ba_2Cu_3O_{7-x}$ oxide superconductor thin film was etched by ion milling using Ar ion so that superconducting electrodes and a bridge portion having equal dimensions to that shown in FIG. 1C were formed. No clear degradation was observed in the superconducting properties of the $(Y, Pr)_1Ba_2Cu_3O_{7-x}$ oxide superconductor thin film after the patterning.

A current-voltage characteristics of the above mentioned Josephson device was measured. When a microwave of 15 GHz and of 0.2 mW was irradiated at 77K, clear Shapiro steps were observed at multiple voltages of 31 $\mu$V, and therefore, it could be ascertained that the Josephson junction was fabricated in the device. In addition, voltage noise at 10 Hz became the minimum at a temperature of 77K, as shown in FIG. 2.

Therefore, it was also confirmed that the above Josephson junction device in accordance with the first embodiment of the present invention had the highest performance under simple liquid nitrogen cooling. In this connection, a temperature rise of the Josephson junction device due to Joul heat was negligible. Since, current flowing through the Josephson junction device was very weak such as several tens to several hundreds micro amperes and resistor of the Josephson junction was smaller than several ohms so that the Joul heat was extremely small.

In the above embodiment, only an artificial grain boundary type Josephson junction device utilizing a bicrystal substrate was described. However, as it is easily understood, the present invention can be applied to every Josephson junction device utilizing oxide superconductors, such as an artificial grain boundary type Josephson junction device utilizing a seed layer, a step type Josephson junction device and a tunnel type Josephson junction device.

Embodiment 3

A third embodiment of the Josephson junction device in accordance with the present invention having an equal shape to that of Embodiment 1 was manufactured. The process will be described.

At first, a bicrystal $SrTiO_3$ substrate equal to that of Embodiment 1, namely having a deposition surface of (100) plane and a misorientation angle of 37° was prepared.

Then, a c-axis orientated $Y_1Ba_2Cu_3O_{7-x}$ oxide superconductor thin film having a thickness of 300 nanometers was deposited on the (100) surface of the bicrystal substrate by a sputtering process using a sintered $Y_1Ba_2Cu_3O_{7-x}$ oxide superconductor pellet as a target. The conditions of the sputtering process were equal to those of Embodiment 1.

The $Y_1Ba_2Cu_3O_{7-x}$ oxide superconductor thin film inherited the bicrystal structure of the substrate so as to comprise two single crystal regions which had different but symmetric crystal orientations, and a grain boundary between the two single crystal regions. The misorientation angle between the two single crystal regions was 37° and the grain boundary constituted a weak link of a Josephson junction.

The critical temperature of the $Y_1Ba_2Cu_3O_{7-x}$ oxide superconductor thin film was 90K.

Thereafter, the $Y_1Ba_2Cu_3O_{7-x}$ oxide superconductor thin film was etched by ion milling using Ar ion so that superconducting electrodes and a bridge portion having equal dimensions to that shown in FIG. 1C were formed. No clear degradation was observed in the superconducting properties of the $Y_1Ba_2Cu_3O_{7-x}$ oxide superconductor thin film after the patterning.

Then, Ti ion was implanted to the $Y_1Ba_2Cu_3O_{7-x}$ oxide superconductor thin film so as to lower its critical temperature. The acceleration energy of the ions was 100 keV and the dose was $5 \times 10^{18}/cm^2$.

The implanting ion is preferably selected from Ti ion, Fe ion, Co ion and Ni ion. The dose preferably ranges $1 \times 10^{17}$ to $1 \times 10^{20}/cm^2$ and the acceleration energy preferably ranges 100 to 200 keV.

By the above ion implantation, the critical temperature of the patterned $Y_1Ba_2Cu_3O_{7-x}$ oxide superconductor thin film was lowered to 81K.

A current-voltage characteristics of the above mentioned Josephson device was measured. When a microwave of 15 GHz and of 0.2 mW was irradiated at 77K, clear Shapiro steps were observed at multiple voltages of 31 $\mu V$, and therefore, it could be ascertained that the Josephson junction was fabricated in the device. In addition, voltage noise at 10 Hz became the minimum at a temperature of 77K, as shown in FIG. 2.

Therefore, it was also confirmed that the above Josephson junction device in accordance with the first embodiment of the present invention had the highest performance under simple liquid nitrogen cooling. In this connection, a temperature rise of the Josephson junction device due to Joul heat was negligible. Since, current flowing through the Josephson junction device was very weak such as several tens to several hundreds micro amperes and resistor of the Josephson junction was smaller than several ohms so that the Joul heat was extremely small.

In the above embodiment, only an artificial grain boundary type Josephson junction device utilizing a bicrystal substrate was described. However, as it is easily understood, the present invention can be applied to every Josephson junction device utilizing oxide superconductors, such as an artificial grain boundary type Josephson junction device utilizing a seed layer, a step type Josephson junction device and a tunnel type Josephson junction device.

Embodiment 4

A fourth embodiment of the Josephson junction device in accordance with the present invention having an equal shape to that of Embodiment 1 was manufactured. The process will be described.

At first, a bicrystal $SrTiO_3$ substrate having a deposition surface of (100) plane and a misorientation angle of 45° was prepared.

Then, a c-axis orientated $Y_1Ba_2Cu_3O_{7-x}$ oxide superconductor thin film having a thickness of 300 nanometers was deposited on the (100) surface of the bicrystal substrate by a sputtering process using a sintered $Y_1Ba_2Cu_3O_{7-x}$ oxide superconductor pellet as a target. The conditions of the sputtering process were equal to those of Embodiment 1.

The $Y_1Ba_2Cu_3O_{7-x}$ oxide superconductor thin film inherited the bicrystal structure of the substrate so as to comprise two single crystal regions which had different but symmetric crystal orientations, and a grain boundary between the two single crystal regions. The misorientation angle between the two single crystal regions was 45° and the grain boundary constituted a weak link of a Josephson junction.

The critical temperature of the $Y_1Ba_2Cu_3O_{7-x}$ oxide superconductor thin film was 90K. However, electric resistance of the grain boundary portion became zero at a temperature of 81K. This lower critical temperature of the grain boundary portion was considered to be due to the large misorientation angle between the two single crystal regions.

Josephson junction devices utilizing bicrystal substrates generally have misorientation angles of on the order of 30°. In this case, critical temperatures of the grain boundary portions are almost the same as those of single crystal regions.

However, if the misorientation angles are far above 30°, such as 45°, critical temperatures of the grain boundary portions are clearly lowered. The Josephson junction device of this Embodiment utilized this phenomenon. Z. G. Ivanov et al. reported about the phenomenon in Appl. Phys. Letter vol. 59, No. 23, pp. 3030–3032, Dec. 2, 1991.

Thereafter, the $Y_1Ba_2Cu_3O_{7-x}$ oxide superconductor thin film was etched by ion milling using Ar ion so that superconducting electrodes and a bridge portion having equal dimensions to that shown in FIG. 1C were formed. No clear degradation was observed in the superconducting properties of the $Y_1Ba_2Cu_3O_{7-x}$ oxide superconductor thin film after the patterning.

A current-voltage characteristics of the above mentioned Josephson device was measured. When a microwave of 15 GHz and of 0.2 mW was irradiated at 77K, clear Shapiro steps were observed at multiple voltages of 31 $\mu V$, and therefore, it could be ascertained that the Josephson junction was fabricated in the device. In addition, voltage noise at 10 Hz became the minimum at a temperature of 77K, as shown in FIG. 2.

Therefore, it was also confirmed that the above Josephson junction device in accordance with the first embodiment of the present invention had the highest performance under simple liquid nitrogen cooling. In this connection, a temperature rise of the Josephson junction device due to Joul heat was negligible. Since, current flowing through the Josephson junction device was very weak such as several tens to several hundreds micro amperes and resistor of the Josephson junction was smaller than several ohms so that the Joul heat was extremely small.

In the above Embodiments, only Josephson junction devices are described. However, the present invention can be applied to SQUID and other devices comprising Josephson junctions.

Additionally, the oxide superconductor thin film can be formed of not only the Y—Ba—Cu—O type compound oxide superconductor material, but also a high-$T_c$ (high critical temperature) oxide superconductor material, particularly a high-$T_c$ copper-oxide type compound oxide superconductor material, for example a Bi—Sr—Ca—Cu—O type compound oxide superconductor material, and a Tl—Ba—Ca—Cu—O type compound oxide superconductor material.

Furthermore, the substrate can be formed of not only the $SrTiO_3$, but also an insulator, for example MgO, YSZ (yttrium stabilized zirconia).

The invention has thus been shown and described with reference to the specific embodiments. However, it should be noted that the present invention is in no way limited to the details of the illustrated structures but converts and modifications may be made within the scope of the appended claims.

I claim:

1. A method of reducing the noise level at the temperature of liquid nitrogen of a Josephson junction device such that the temperature dependent noise of the Josephson junction is at a minimum at the temperature of liquid nitrogen, comprising the step of forming two superconducting electrodes of an oxide superconductor, wherein the electrodes are connected through a Josephson junction, wherein the oxide superconductor is characterized by an impurity which lowers the critical temperature as compared to a conventional oxide superconductor so that the temperature dependent noise of the Josephson junction is at a minimum at the temperature of liquid nitrogen.

2. A method as claimed in claim 1, wherein the oxide superconductor is Pr-doped $YBaCuO_{7-\delta}$, where $0.3<y<0.5$ and Pr/Y=0.05, which is implanted Ti, Fe or Co at a dose ranging from $1\times10^{17}$ to $1\times10^{20}/cm^2$.

3. A method as claimed in claim 1, wherein said superconducting electrodes comprise an impurity which lowers the critical temperature as compared to a conventional oxide superconductor so that temperature dependent noise of the Josephson junction is at a minimum at the temperature of liquid nitrogen.

4. A method of reducing the noise level at the temperature or liquid nitrogen of a Josephson junction device as claimed in claim 1, wherein the oxide superconductor is implanted with Ti, Fe or Co at a dose ranging from $1\times10^{17}$ to $1\times10^{20}/cm^2$.

5. A method as claimed in claim 1, wherein the oxide superconductor is formed of an oxide superconductor material selected from the group consisting of a Y-Ba—Cu—O type compound oxide superconductor material, a Bi—Sr—Ca—Cu—O type oxide superconductor material, and a Tl—Ba—Ca—Cu—O type compound oxide superconductor material.

6. A method as claimed in claim 5, wherein the Josephson junction device is formed of a Y—Ba—Cu—O type oxide superconductor thin film comprising two single crystal regions having different crystal orientations, which constitute the superconducting electrodes and a grain boundary between the two single crystal regions which constitutes a weak link of the Josephson junction and wherein the oxide superconductor includes an impurity of Pr at a ratio Pr/(oxide superconductor) of 0.05.

7. A method as claimed in claim 6, wherein the oxide superconductor forms a solid solution with the impurity.

8. A method as claimed in claim 6, wherein the oxide superconductor is $(Y,Pr)Ba_2Cu_3O_{7-x}$ where $0<x<0.3$, and Pr/Y=0.05.

9. A method as claimed in claim 6, comprising a substrate formed of a material selected from the group consisting of a MgO (100) substrate, a $SrTiO_3$ (110) substrate and an yttrium stabilized zirconia substrate.

10. A method as claimed in claim 6, wherein the Josephson junction device comprises a bicrystal substrate of misorientation angle of 37° and the oxide superconductor thin film is formed on the substrate, which inherits the misorientation angle so as to include two single crystal regions which constitutes the superconducting electrodes and a grain boundary between the two single crystal regions which constitutes a weak link of the Josephson junction.

11. A method as claimed in claim 6, wherein the grain boundary of the oxide superconductor thin film is positioned at a narrow portion.

12. A method as claimed in claim 11, wherein the narrow portion of the oxide superconductor thin film has a width of 5 µm and a length of 10 µm.

* * * * *